(12) United States Patent
Baumgartner et al.

(10) Patent No.: US 6,580,266 B2
(45) Date of Patent: Jun. 17, 2003

(54) THIN FILM DELAMINATION DETECTION FOR MAGNETIC DISKS

(75) Inventors: Bradley Frederick Baumgartner, Los Banos, CA (US); Shanlin Duan, Fremont, CA (US); Yan Liu, Cupertino, CA (US); Bob C. Robinson, Hollister, CA (US); Li Tang, Fremont, CA (US); Ka Chi Wong, Fremont, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 0 days.

(21) Appl. No.: 10/053,016

(22) Filed: Nov. 2, 2001

(65) Prior Publication Data

US 2003/0085701 A1 May 8, 2003

(51) Int. Cl.$^7$ ........................ G01R 33/12; G01N 27/82; G11B 5/84; B24B 39/06
(52) U.S. Cl. ........................ 324/212; 29/90.01
(58) Field of Search ................. 324/210, 212, 324/71.1; 360/25, 31, 131, 135; 29/90.01, 593; 369/53.13–53.17, 53.2; 73/104, 105

(56) References Cited

U.S. PATENT DOCUMENTS

| 5,423,111 A | * | 6/1995 | Mori ........................ 29/90.01 |
| 5,658,191 A | | 8/1997 | Brezoczky |
| 5,764,545 A | * | 6/1998 | Cannata et al. ............. 702/123 |
| 5,825,180 A | * | 10/1998 | Guzik ........................ 324/212 |
| 6,100,971 A | | 8/2000 | Imaino |
| 6,262,572 B1 | | 7/2001 | Franco et al. |

OTHER PUBLICATIONS

Coufal, et al., Monitoring of Adhesion Strength Between Materials by Photo–Acoustic Pulse Generation at or Near the Interface, IBM Technical Disclosure Bulletin, 07–85, pp. 487–490.

Horne, et al., Method and Apparatus for Detecting Defects and Delaminations on a Thin Film Disk, IBM Technical Disclosure Bulletin, 03–94, pp. 521–522.

* cited by examiner

Primary Examiner—Gerard R. Strecker
(74) Attorney, Agent, or Firm—G. Marlin Knight

(57) ABSTRACT

An apparatus and method for detecting and marking delamination defects on thin film disks are disclosed. The apparatus includes a read/write (R/W) head and a burnishing head mounted on separate arms that access the disk while spinning on the test stand. The controller uses the R/W head to perform an initial magnetic test of selected areas on the disk to establish an initial defect map. The burnish head is then flown over the surface for an extended time to accelerate and open up the latent delamination defects by impacting protruding material. The R/W head is then used to perform a second magnetic test which is compared against the first test to identify the delamination defects which have been developed by the burnishing. The delamination defects are then marked with a magnetic pattern which aids in optically locating the defect during subsequent failure analysis.

11 Claims, 3 Drawing Sheets

THIN FILM DELAMINATION DETECTION FOR MAGNETIC DISKS

FIELD OF THE INVENTION

The invention relates to manufacturing and testing apparatus for thin film disks and more particularly to apparatus and methods for detecting film delamination defects in thin film disks.

BACKGROUND OF THE INVENTION

A typical prior art head and disk system 10 is illustrated in FIG. 1. In operation the magnetic transducer 11 is supported by the suspension 13 as it flies above the disk 16. The magnetic transducer 11, usually called a "head" or "slider," is composed of elements that perform the task of writing magnetic transitions (the write head 23) and reading the magnetic transitions (the read head 12). The electrical signals to and from the read and write heads 12, 23 travel along conductive paths (leads) 14 which are attached to or embedded in the suspension 13. The magnetic transducer 11 is positioned over points at varying radial distances from the center of the disk 16 to read and write circular tracks (not shown). The disk 16 is attached to a spindle 18 that is driven by a spindle motor 24 to rotate the disk 16. The disk 16 comprises a substrate 26 on which a plurality of thin films 21 are deposited. The thin films 21 include ferromagnetic material in which the write head 23 records the magnetic transitions in which information is encoded. The thin film protective layer (not shown in FIG. 1) is typically the last or outermost layer.

The conventional disk 16 typically has a substrate 26 of AlMg or glass. The thin films 21 on the disk 16 typically include a chromium or chromium alloy underlayer that is deposited on the substrate 26. The magnetic layer in the thin films 21 is based on various alloys of cobalt, nickel and iron. For example, a commonly used alloy is CoPtCr. However, additional elements such as tantalum and boron are often used in the magnetic alloy.

FIG. 2 illustrates one common internal structure of the thin films 21 on disk 16. The protective overcoat 35 is used to improve wearability and corrosion. The magnetic layer 34 is immediately under the overcoat 35. The magnetic layer 34 is deposited on an underlayer 33 which is in turn deposited on a seed layer 32. The seed layer 32 is deposited on the substrate 26. Since the seed layer 32 is the initial thin film deposited on the substrate 26, it plays a critical role in the adherence of the thin film structure to the substrate. For nonmetallic substrates various seed layer materials have been suggested including chromium, titanium, tantalum, CrTi, $Ni_3P$, MgO, carbon, tungsten, AlN, FeAl, RuAl and NiAl.

One of the prior art steps in processing thin film magnetic disks has been burnishing. The burnishing process flies a special type of slider structure over the disk surface to physically remove high spots from the disk surface. U.S. Pat. No. 5,658,191 to Brezoczky describes a type of burnishing head and the process of using it.

The prior art manufacturing process for thin film disks has included various optical, magnetic and physical tests. An optical inspection system is described in U.S. Pat. No. 6,100,971 to Imaino, et al., which is commonly assigned with the present application. One physical test is called a glide test. A glide test is used to gauge the suitability of the surface of the disk for "flying" the read/write (R/W) head. One prior art glide test is described in U.S. Pat. No. 6,262,572 issued to Franco, et al. A glide test using a thermo-resistive element is used to detect thermal asperities which are caused by irregularities in the surface of the disk. Franco '572 suggests using a glide head that is much wider than an actual R/W head in order to speed up the process of testing a disk.

One of the failure mechanisms for thin film disks is delamination of the thin film structure from the substrate. In typical manufacturing procedures delaminations are often not detected until the disk is installed in and tested in the final disk drive assembly. It is clearly advantageous to detect defects on a disk prior to installation in a drive. An additional problem in delamination defect analysis is being able to locate the defect in a microscope field for failure analysis. The critical defects are not visible with the naked eye, so it can be time consuming to search for the defect using any type of high magnification device.

SUMMARY OF THE INVENTION

The applicants disclose an apparatus and method for detecting and marking delamination defects on thin film disks. The apparatus includes a read/write (R/W) head and a burnishing head mounted on separate arms that access the disk while spinning on the test stand. The R/W head performs an initial magnetic test of selected areas on the disk to establish an initial defect map. The burnish head is then flown over the surface for an extended time to accelerate and open up the latent delamination defects by impacting protruding material. The R/W head then performs a second magnetic test which is compared against the first test to identify the delamination defects which have been developed by the burnishing. The delamination defects are then marked with a magnetic pattern which aids in optically locating the defect, for subsequent failure analysis.

DETAILED DESCRIPTION OF THE INVENTION AND THE PREFERRED EMBODIMENTS

Figure 1:
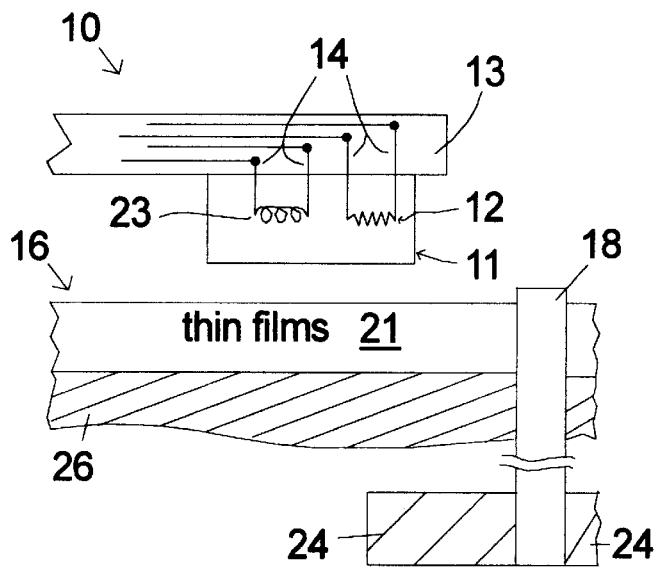
FIG. 1 is a symbolic illustration of the prior art showing the relationships between the head and associated components in a disk drive.
Figure 2:
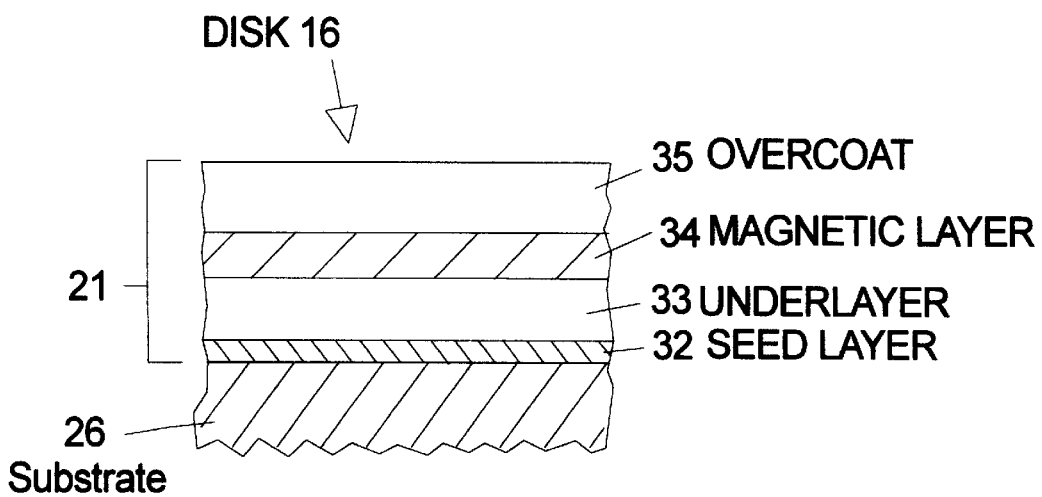
FIG. 2 is an illustration of a layer structure for a prior art magnetic thin film disk.
Figure 3:
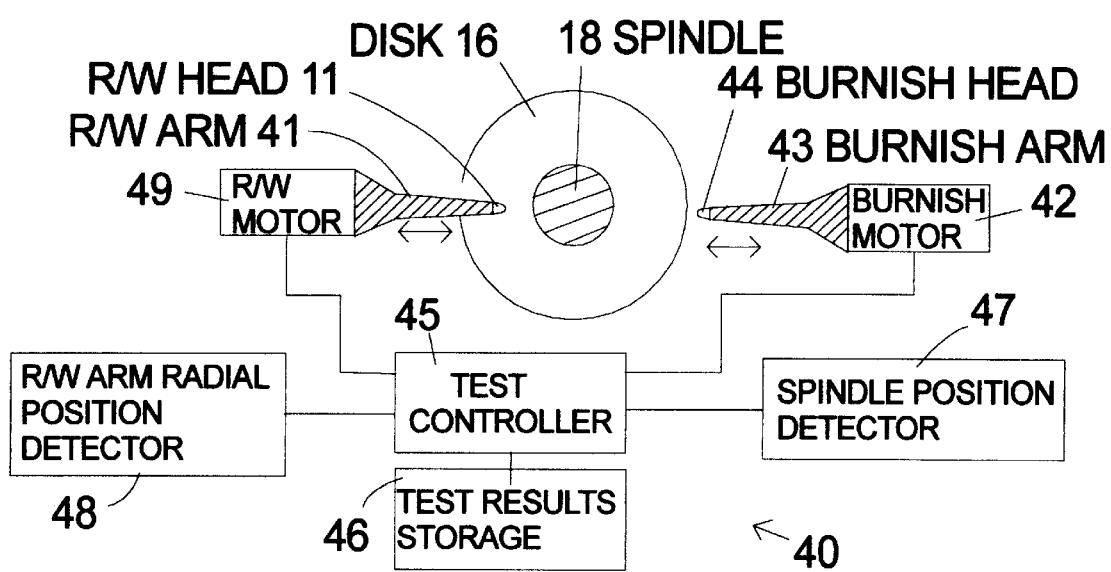
FIG. 3 is a block illustration of an apparatus according to the invention.

Reference is made to FIG. 3 to begin the description of a delamination testing apparatus 40 according to the invention. A spindle 18 supports and rotates disk 16. The spindle motor (not shown) rotates the disk at speeds comparable to those which will be used in the disk drive in which the disk will be used. Disk rotation speeds have tended to increase as faster access times have been demanded, but rotation speeds on the order of 7200 rpm's are to be reasonably expected. The disk can either be manually loaded onto the spindle by an operator or by automated means. Once loaded, the read/write test controller 45 positions the R/W head 11 over the rotating surface of the disk using RAW arm 41. The R/W head is preferably the same type of head which will be used in the disk drive for which the disk is intended. This allows the magnetic test to duplicate the actual performance conditions of areal density, track width etc. The test controller 45 can conveniently be based on a general purpose computer. The controller must be programmed to conduct the tests and control the sequence of events. The magnetic tests which are performed on the thin films on the disk write and read back various patterns of magnetic transitions to ascertain the ability of selected portions of the thin films to perform properly. While one hundred percent testing can be done, it is preferable to perform a subset test that includes a sufficient fraction of the surface to provide a high probability of finding defects while minimizing the time required. One head can only test one bit at a time, so complete testing of the multiple gigabytes on a single disk is time consuming. The best coverage versus time tradeoff can be determined empirically for a particular disk and disk drive combination. Testing on the order of 30% of the surface is suggested as a starting point from which the percentage can be adjusted up or down depending on the empirical results and the time required.

The results from the initial R/W test are stored in some type of memory or disk storage. In FIG. 3 the storage component is labeled test results storage 46. The test results storage 46 can be the RAM of a computer, a disk drive attached to a computer, etc. The results can also be uploaded to host for subsequent download. It is important that location information be recorded for each detected failure, so that failures which are found in the second R/W test can determined to be new or old. The thin films on the disk are essentially homogenous circumferentially and radially, so the test controller 45 must establish one or more reference points from which the location of the defects can be judged. The servo information which is ultimately written on the disks to allow the disk drive to precisely locate points on the surface of the disk is not present when the disks are being tested at this stage of the manufacturing process. The reference points must be maintained unchanged through the entire delamination defect identification process; therefore, once the disk is clamped onto the spindle of the tester, it cannot be unclamped until the test is complete. Once the disk is clamped onto the spindle, the angular position of the spindle is used to record the angular location of the defect. The spindle position detector 47 provides the test controller 45 with at least one index signal a predetermined position of the spindle which can then be used along with the rotation speed and an elapsed time from the index signal until the angular position of the failure to interpolate the angular position of the defect. The radial position of the defect must also be known and recorded to identify the defect. The position of the R/W arm 41 or equivalently the position of the R/W head is used to locate the defect radially on the disk. The R/W arm radial position detector 48 provides this information to the R/W test controller 45. The actuator or R/W motor 49 for the R/W arm can be any precision positioning apparatus. One conveniently available type is a linear, piezo-electric optical scanner motor. Although it is preferable to have a R/W radial position detector 48, if the scanner motor, etc. is sufficiently accurate, has high repeatability and is calibrated, it would be possible to dispense with the position detector. It is to be noted the delamination tester does not mimic the way that a disk drive locates positions on the surface of the disk. In a disk drive the servo information recorded on the disk and read by the head determines the address of the radial position.

Figure 4:
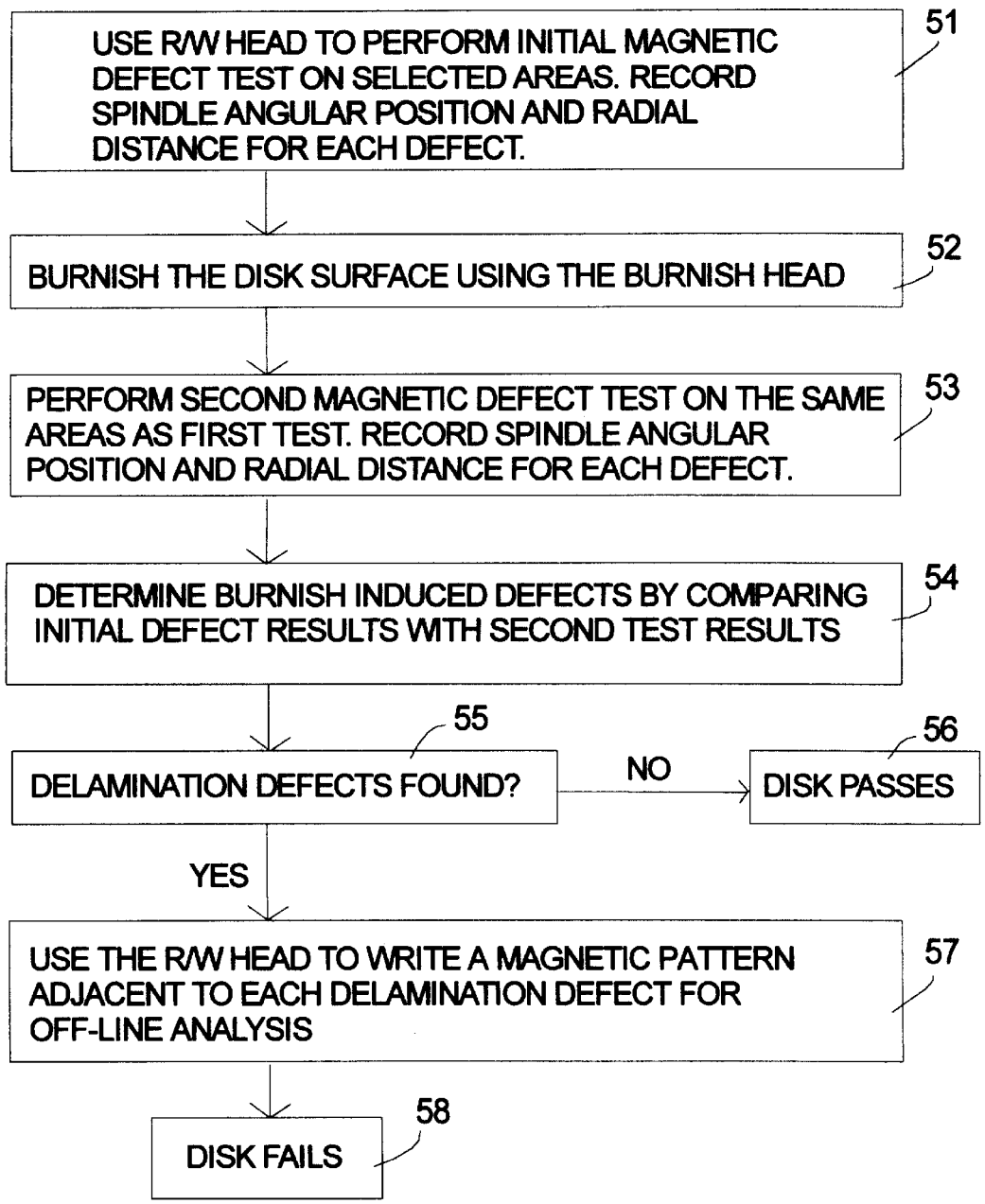
FIG. 4 is a flow chart of the steps of a method according to the invention.

The initial magnetic testing step 51 is shown in the flowchart in FIG. 4. The selection of patterns, duration and other details of the magnetic testing are according to prior art principles. The magnetic defects found in the test are recorded for future reference. Although a single coordinate pair designating the beginning position of the defect can be used, it is also possible to record a second coordinate pair or length to specify the extent of the defect. After the first magnetic test is complete the R/W arm 41 is preferably withdrawn from disk.

The next step is to burnish the entire disk surface using the burnish head 44 on the burnish arm 43. This is step 52 as shown in FIG. 4. Although a R/W head is capable of some degree of burnishing, it is preferable to use a separate burnish head 44. A burnish head 44 provides greater durability and lower costs. In comparison to a RAW head, the burnishing head 44 is also designed according to prior art principles to fly lower and at an increased pitch angle to better perform the task of cutting off the high points of the surface of the disk. The actuator or burnish motor 42 for the burnish arm 43 need not be as precise as the one used for the R/W arm. A linear DC scanner motor is a convenient choice to position the burnish arm 43. Unlike the magnetic testing, the burnishing should be performed on the entire usable surface of the disk. The burnish accomplishes at least two purposes: 1) it smoothes the disk surface; and 2) accelerates the opening up of film delamination defects. By burnishing for a sufficiently long time delamination defects which were latent, i.e., which are not visible and did not result in magnetic failure, will be opened up to cause a magnetic failure and made to be optically visible as well. The delamination defects allow the thin film structure to protrude above the surrounding film and, therefore, to be cut open by the burnishing head. The length of time required for adequate acceleration of the latent delamination defects can only be made by taking into consideration the percentage of escapes that can be tolerated, the cost of the process, etc. which are the typical factors for engineering test procedures.

After the burnishing step has been concluded, a second magnetic test is performed 53. The goal is to identify magnetic defects induced by the burnishing process, so the second test is preferably identical to the first test in site selection, bit patterns and duration. Each defect found in the second test is checked against the stored results of the first test 54. Defects found at locations where no defect was found in the first test and indicative of delamination. If extent or length of the defect was recorded in the first test, it will also be possible to determine if a defect was enlarged by burnishing. If no delamination defects are found 55, then the disk passes 56. If delamination defects are found, the next step is to mark the defects 57 to facilitate off-line analysis of the defects which can be performed on disks which have failed 58. One method of converting magnetic patterns into optically visible patterns Is to develop the disk using ferrofluid. The marking of the defects is performed to create a much larger pattern adjacent to the defect that is more readily visible than the defect itself. The R/W head is used to write a pattern of magnetic transitions on multiple tacks adjacent to or surrounding the defect. When developed using a ferrofluid, a set of magnetic transitions written side by side on the disk can form any selected pattern, but a simple set of horizontal bars surrounding the defect is sufficient. The relatively large ferrofluid feature can then be used to more easily position the field of view of an optical microscope or other imaging device such as atomic force microscope.

The invention has been particularly described with respect to use with thin film magnetic disks, but use with magneto-optic disks will be apparent to those skilled in the art.

What is claimed is:

1. An apparatus including:
    a spindle for rotatably supporting a disk with thin film material deposited on a substrate;

a read/write head movably connected to a first motor that selectably positions the read/write head in flying position over the surface of the disk;

a burnishing head movably connected to a second motor that selectably positions the burnishing head in flying position over the surface of the disk; and a test controller which conducts a first magnetic test using the read/write head and the first motor on selected areas of the thin film material to find failures and records first test results including information on locations of the failures, flies the burnishing head over the disk surface subsequent to the first magnetic test to mechanically impact areas of the disk surface which have the thin film material protruding upward from the surface of the disk, conducts a second magnetic test on the selected areas of the thin film material subsequent to burnishing to find failures and obtain second test results, compares the first test results with the second test results to identify failures in the second test results which were not present in the first test results to obtain burnish induced failures and uses the read/write head to write identifiable magnetic information on the disk near each burnish induced failure to aid in subsequent location of the failure.

2. The apparatus of claim 1 further comprising a spindle position detector which generates an index signal at a selected angular position of the spindle while the spindle is rotating and wherein the test controller uses the index signal to derive an angular position of the location of the failure and the information on locations of the failures includes the angular position.

3. The apparatus of claim 2 further comprising a read/write head position detector which provides a radial position of the read/write head over the thin film disk and wherein the test controller records the radial position of the failure in the first test results.

4. The apparatus of claim 1 wherein the first test results includes information on a length of the failure.

5. The apparatus of claim 1 wherein the first motor is a linear piezoelectric motor.

6. A method of processing a thin film disk comprising the steps of:

clamping the thin film disk to spindle coupled to spindle motor;

rotating the thin film disk;

moving a read/write head over selected areas of the thin film disk and writing and reading patterns of magnetic transitions to conduct a first test of the selected areas;

recording results of the first test including information on the location of each test failure found in the first test;

burnishing the thin film disk by positioning a burnishing head over the thin film disk while rotating and moving the burnishing head radially to burnish substantially all of a surface of the thin film disk;

moving the read/write head over the selected areas of the thin film disk and writing and reading patterns of magnetic transitions to conduct a second test of the selected areas to identify locations of failures after burnishing;

comparing the information on the location of each test failure found in the first test with the locations of failures in the second test to obtain a list of burnish induced failures; and writing a pattern of magnetic transitions adjacent to each burnish induced failure.

7. The method of claim 6 wherein the step of recording results of the first test further comprises recording information on the length of each test failure found in the first test.

8. The method of claim 6 wherein the step of recording results of the first test further comprises recording information on the angular position of each test failure found in the first test.

9. The method of claim 8 wherein the angular position of each test failure is found by interpolation using an index signal which identifies a predetermined angular position of the spindle, a rotation speed and an elapsed time from the index signal until the angular position of the failure.

10. The method of claim 8 wherein the step of recording results of the first test further comprises recording information on the radial position of each test failure found in the first test.

11. The method of claim 6 further comprising the step of developing the thin film with a ferrofluid to make the pattern of magnetic transitions adjacent to each burnish induced failure visible.

* * * * *